(12) United States Patent  (10) Patent No.: US 7,135,850 B2
Ramirez  (45) Date of Patent: Nov. 14, 2006

(54) ELECTRICITY METER WITH POWER SUPPLY LOAD MANAGEMENT

(75) Inventor: Anibal D. Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 0 days.

(21) Appl. No.: 11/353,738

(22) Filed: Feb. 13, 2006

(65) Prior Publication Data

US 2006/0158177 A1  Jul. 20, 2006

Related U.S. Application Data

(62) Division of application No. 10/661,114, filed on Sep. 12, 2003, now Pat. No. 7,009,379.

(51) Int. Cl.
*G01R 7/00* (2006.01)

(52) U.S. Cl. .............. 324/142; 340/870.02; 702/65

(58) Field of Classification Search ............. None
See application file for complete search history.

(56) References Cited

U.S. PATENT DOCUMENTS

| | | | |
|---|---|---|---|
| 4,335,447 A | 6/1982 | Jerrim | |
| 4,575,640 A | 3/1986 | Martin | |
| 4,594,545 A | 6/1986 | Germer | |
| 4,662,736 A | 5/1987 | Taniguchi et al. | |
| 4,701,858 A | 10/1987 | Stokes et al. | |
| 4,987,363 A | 1/1991 | Gibbs et al. | |
| 4,999,575 A | 3/1991 | Germer | |
| 5,070,481 A | 12/1991 | Haubner et al. | |
| 5,216,357 A | 6/1993 | Coppola et al. | |
| 5,414,861 A | 5/1995 | Horning | |
| 5,471,137 A | 11/1995 | Briese et al. | |
| 5,488,565 A | 1/1996 | Kennon et al. | |
| 5,544,089 A | 8/1996 | Hemminger et al. | |
| 5,650,669 A | 7/1997 | Aldous | |
| 5,680,294 A | 10/1997 | Stora et al. | |
| 5,809,311 A | 9/1998 | Jones | |
| 5,923,099 A | 7/1999 | Bilir | |
| 5,940,009 A | 8/1999 | Loy et al. | |
| 5,942,811 A | 8/1999 | Stumfall et al. | |
| 6,112,158 A | 8/2000 | Bond et al. | |
| 6,115,676 A | 9/2000 | Rector et al. | |
| 6,476,519 B1 | 11/2002 | Weiner | |
| 6,885,185 B1 * | 4/2005 | Makinson et al. | .......... 324/142 |

* cited by examiner

*Primary Examiner*—Minh N. Tang
(74) *Attorney, Agent, or Firm*—Maginot, Moore & Beck

(57) ABSTRACT

An electricity meter for monitoring electric power consumed from a service line is disclosed. The electricity meter includes a power consumption metering system for measuring the amount of power consumed from the service line, a peripheral device providing a non-critical function, a power converter, and a load management system. The metering system includes a controller and data storage for storing power consumption data. The power converter provides an unregulated voltage output at the terminals of a capacitor for powering the metering system. The load management system selectively couples and decouples the peripheral device from the power converter. The load management system senses the unregulated voltage to determine whether to couple or decouple the peripheral device. A load management system for an electricity meter and a method of managing the loads on the power system of an electricity meter are also disclosed.

10 Claims, 6 Drawing Sheets

ELECTRICITY METER WITH POWER SUPPLY LOAD MANAGEMENT

CROSS REFERENCE TO RELATED APPLICATIONS

This application is a divisional of U.S. patent application Ser. No. 10/661,114, filed Sep. 12, 2003 now U.S. Pat. No. 7,009,379, for all matters disclosed therein.

FIELD OF THE INVENTION

This invention relates generally to electricity meters and more particularly to power supply load management for electricity meters.

BACKGROUND OF THE INVENTION

Electrical utility service providers, or simply utilities, generate polyphase electrical power, and typically three phase power. Polyphase electrical power is alternating current ("AC") electrical power that is supplied on a plurality of power supply lines wherein the voltage waveform on each of the power supply lines has a unique phase angle. While only a single phase of the polyphase electrical power may typically be provided for single family residences, true polyphase electrical power is typically provided to larger facilities such as commercial and industrial facilities.

Utilities monitor energy usage by customers through electricity meters. Electricity meters track among other things, the amount of energy consumed, typically measured in kilowatt-hours ("kwh"), at each customer's facility. The utility uses the consumption information primarily for billing, but also for resource allocation planning and other purposes.

Modern solid state electricity meters typically include microcontrollers and memory for sensing and storing various electrical usage parameters and metrics data. This data is stored in memory and can be referenced by service technicians and meter readers. Solid state electricity meters also attempt to store vital billing information, power line events, time stamps, and other metrics in a non-volatile memory once a power line outage is detected.

In the past, utility personnel physically observed meter data on mechanical counters or electronic displays. Modern meters still often include interfaces such as optical ports and displays for on-site observation by utility personnel. However, because meters are generally located at the facility of the utility customer, such methods of meter reading are labor intensive and expensive. Modern electricity meters attempt to facilitate remote access to meter data by providing optional communications devices.

Thus, many modern electricity meters include electronics modules having a measurement board and optional electronic assemblies such as on-board communications devices facilitating remote control and programming of the meter and remote access to data acquired by the meter. The measurement board typically includes the sensors, signal processors, microcontroller and memory for data acquisition and storage, also known as a metering system or circuitry. The measurement board also typically includes an on-board power supply providing power to the data acquisition and storage devices and the optional electronic assemblies.

Various types of remote meter reporting systems have been proposed and/or implemented in optional electronic assemblies. Optional communications devices may include relays programmable for KYZ, EOI, LC, DTA, power factor threshold alert and voltage threshold alerts and real time communications links such as are modems, RS-232, RS-485, radios and power line transceivers, or the like.

One problem with optional communications devices, and especially with wireless radio communications, in utility meters arises from the high power requirements of such devices. For example, wireless paging technology can require in excess of one amp of current at approximately eight to ten volts. This power requirement far exceeds the power requirement for the remainder of the meter circuitry. Typically, even more advanced polyphase electric utility meters only require substantially less than one amp of current. As a consequence, if the power supply in a utility meter is designed to accommodate the worst case load anticipated due to the presence of wireless pager transmitters or other optional communications devices, the power supply must be drastically different, and generally much larger, then the power supply in the same utility meter without such optional communication devices.

The larger capacity power supply both occupies additional space within the meter and has increased cost. Because a utility meter is only required to perform these optional communication functions a very small fraction of the overall operating time of the meter, such additional power generating capacity goes unused for a substantial majority of the time. As a consequence, the relatively infrequent need for additional power does not necessarily justify the additional size, weight and cost issues that arise from the use of a large capacity power supply.

Data acquisition and storage hardware and communications hardware are both typically DC devices. The power supply in electricity meters converts AC power from the service line to DC power, some of which is stored in storage and smoothing capacitors. As previously stated, both the data acquisition and storage and optional communications modules require power for operation.

A typical onboard power supply utilized in electricity meters is a wide range switching power supply. A single wide range switching power supply may supply the power for both the data acquisition hardware and the communications hardware. Switching power supplies store DC energy in capacitors. The DC energy stored in the capacitors is typically used to sustain the operation of the microcontroller until the non-volatile memory write cycle is completed (approx. 400 mS) during power outages. The rate at which the DC energy is depleted from such capacitors upon interruption of the AC power varies significantly when communication devices are connected to the main power supply. For example, some communications devices could draw up to 250 mA dc during bursts of 100 mS and remain idle during several seconds. During start-up, shutdown, heavy load periods or loss of service, the energy stored in the capacitors can be used by these communications devices before critical data is stored resulting in a loss of critical data.

In some electrical devices, load management has been implemented in the peripheral circuitry which incorporated a load control circuit to reduce the peripherals power consumption during line power outages. When load management is not provided in an electricity meter, excessive capacitive loads added by external peripherals during the initial startup disturb the power supply operation e.g. the switcher does not start up because the over-current protection is tripped. However, when separate load control cir cuitry is provided for each peripheral device, the additional expense can be cost prohibitive. Load management seeks to disconnect the communications devices when insufficient power is available to guarantee operation of data storage functions.

Those skilled in the art will recognize that the primary function of an electricity meter is to acquire and store data necessary to determine the electrical consumption. Providing communication for remote data acquisition and the like is a secondary function of electricity meters. Thus, should the power generated by the on-board power supply be insufficient to power both the data acquisition and storage hardware and the communications hardware, whether during start-up, shut-down heavy load periods or power loss, then it is preferable that power be supplied to the data acquisitions and storage hardware.

Thus, a need exists for a load management system which economically facilitates remote access to the functions of an electricity meter and the data stored therein while protecting the data from loss during outages or overload situations.

SUMMARY

A micro controller based peripheral load management system that engages and disengages peripheral DC loads from the power supply of an electricity meter addresses one or more of the above needs, as well as others.

According to one aspect of the disclosure, an electricity meter for monitoring electric power consumed from a service line includes a power consumption metering system for measuring the amount of power consumed from the service line, a peripheral device providing a non-critical function, a power converter, and a load management system. The metering system includes a controller and data storage for storing power consumption data. The power converter provides an unregulated voltage output at the terminals of a capacitor for powering the metering system. The load management system selectively couples and decouples the peripheral device from the power converter. The load management system senses the unregulated voltage to determine whether to couple or decouple the peripheral device.

According to another aspect of the disclosure, a load management system for an electrical meter monitoring power usage from a service line is provided. The meter has a power supply, a data acquisition and storage circuit and a peripheral device. The acquisition and storage circuit includes a controller. The power supply is coupled to the service line and includes a storage capacitor having an unregulated voltage present across its terminals. The power supply powers the data acquisition and storage circuit. The load management system includes a signal generator, an electrically controlled switch having an ON state and an OFF state, and a conductive branch coupled to the peripheral device and including the electrically controlled switch. The signal generator generates a control signal having a level dependent upon the voltage across the terminals of the capacitor. The state of the switch is dependent upon the level of the control signal, and when the switch is in its ON state the peripheral device is electrically coupled to and powered by the power supply when the switch is in its OFF state the peripheral device is electrically decoupled from the power supply.

According to another aspect of the disclosure, a method of managing the load on a power supply in an electricity meter having a power supply converting service line power to regulated dc power using circuitry including a storage capacitor having an unregulated voltage across its terminals, metering circuits coupled to the power supply output and utilizing a controller to acquire data and memory to store data and a plurality of peripheral circuits each configured to be selectively coupled to the power supply output when mounted within the meter is disclosed. The load management method includes the steps of sensing the presence of the unregulated voltage, selecting one of the plurality of peripheral devices and mounting the selected peripheral device in the meter and using the controller to compare the sensed unregulated voltage to a threshold value to decide whether to couple or decouple the selected peripheral device and the power supply. The selected peripheral device is coupled to, or decoupling from, the power supply based on the outcome of the deciding step. The comparing, deciding and coupling or decoupling steps are then repeated.

Additional features and advantages of the present invention will become apparent to those skilled in the art upon consideration of the following detailed description of preferred embodiments exemplifying the best mode of carrying out the invention as presently perceived.

BRIEF DESCRIDTION OF THE DRAWINGS

The illustrative device will be described hereinafter with reference to the attached drawings which are given as non-limiting examples only, in which.

DETAILED DESCRIPTION OF THE DRAWINGS

Figure 1:
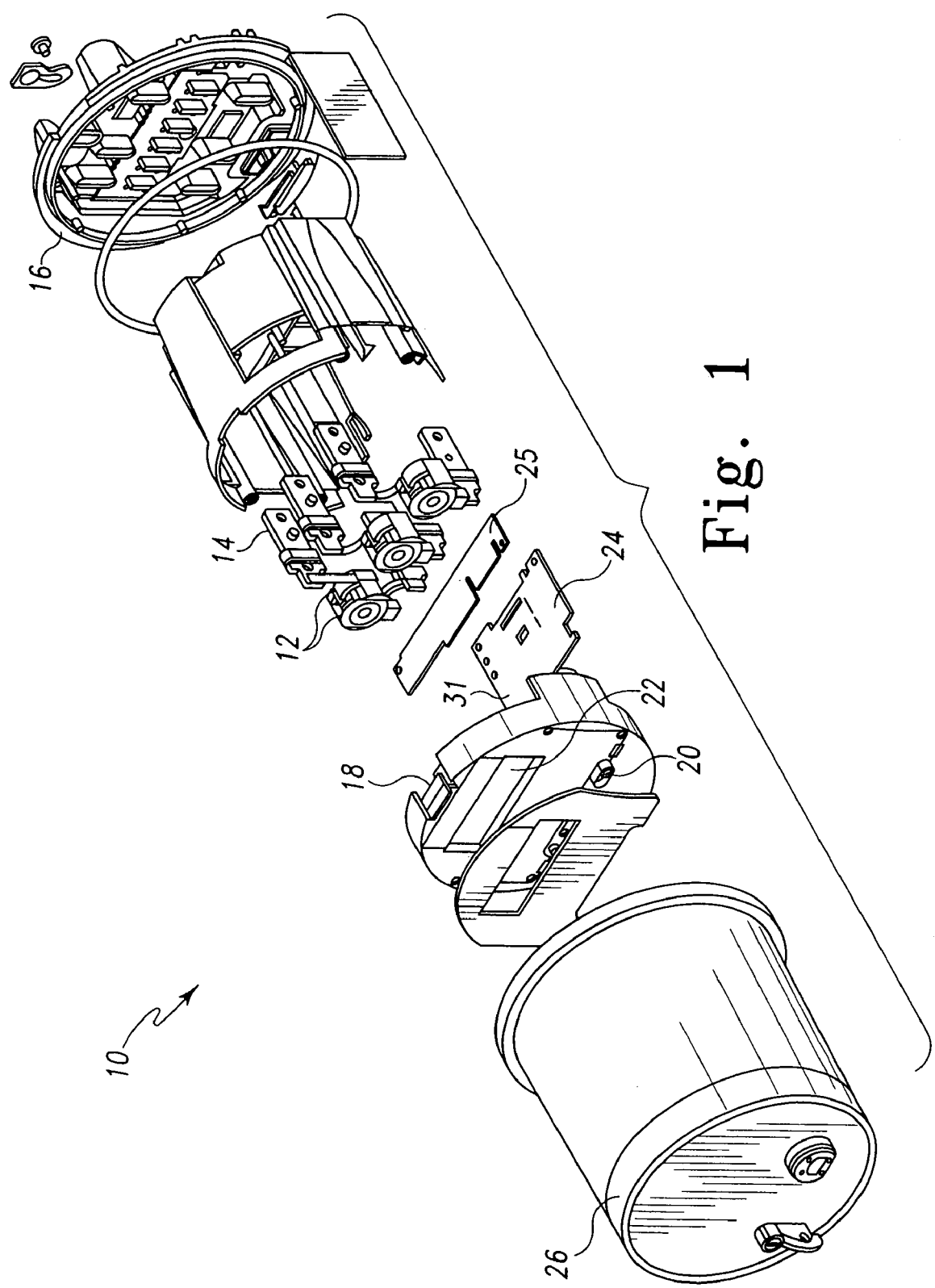
FIG. 1 is an exploded view of an electricity meter showing a printed circuit board containing a power supply, data acquisition and storage hardware and a load management system and an optional printed circuit board containing communications hardware.
Figure 2:
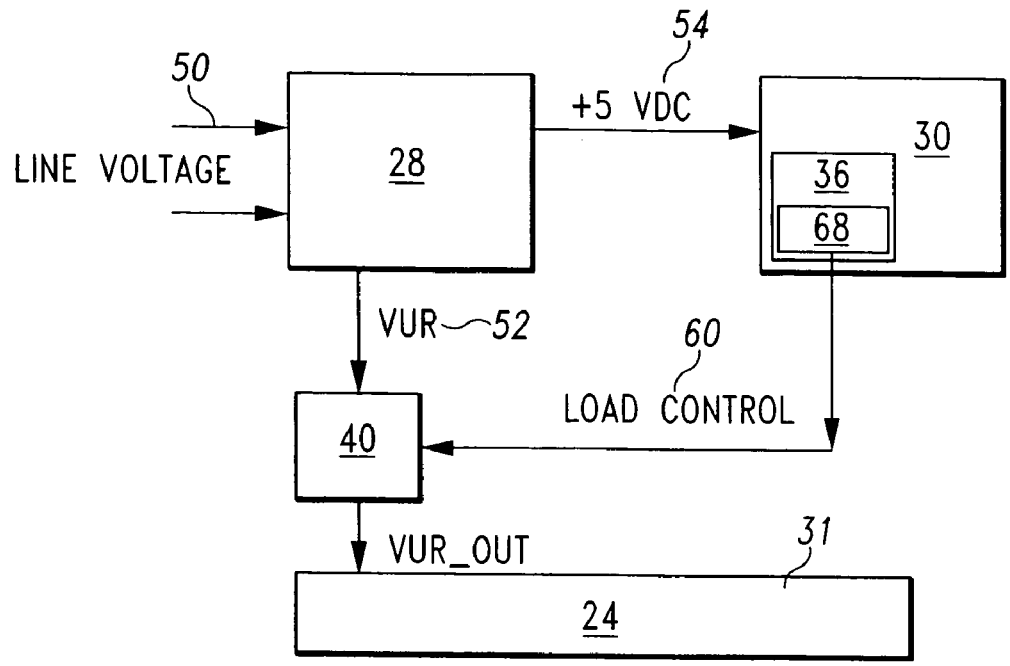
FIG. 2 is a block diagram of the power supply, data acquisition and storage hardware, optional communications hardware and a first embodiment of a load management system.

As shown for example, in FIG. 1, electricity meters 10 include coils 12 having blades 14 passing through a base plate 16 for coupling to the electrical service line 50 (see FIGS. 2 and 3) from which power consumption will be monitored. A PWB, register or measurement board 18 is provided on which hardware is present for acquisition, processing and storage of power consumption data and other metrics. Such hardware is referred to herein as data acquisition and storage hardware 30. Data acquisition and storage hardware 30 (see FIG. 2) implements the primary critical function of the electricity meter 10, i.e. to acquire and store power consumption data for access by utility personnel.

As shown for example, in FIG. 1, the electricity meter 10 includes an interface illustratively including an optical port 20 and a display 22 for, among other things, optically displaying acquired data for on-site observation by utility personnel. Optional printed circuit boards 24 are often included in electrical meters 10 to expand the user interfaces by providing additional communication options for downloading and transmission of acquired data. Among the typical communication options are modems, RS-232, RS-485, radios, power line transceivers and relays. The hardware for implementing each of these communications options, and other hardware for implementing non-critical functions of electricity meters, will be identified herein as optional communication devices or peripheral devices 31. Such optional communication devices or peripheral devices 31 are represented schematically in FIG. 3 by a capacitive load 78 and a resistive load 86.

The data acquisition and storage hardware of measurement circuit 30 may include one or more processors and associated circuitry. Such measurement and control circuits for use in utility meters 10 are well known. In many cases, the measurement circuit 30 involves a combination of a digital signal processor and a microprocessor or microcontroller. Examples of such a circuit include the combination of the conversion circuit and micro controller in U.S. Pat. No. 6,112,158, to Bond, et al., the front end CPU and register CPU of U.S. Pat. No. 5,471,137 to Briese et al., and the A/D and DSP 14 and micro controller 16 of U.S. Pat. No. 5,544,089 to Hemminger et al., all of which are incorporated herein by reference.

The measurement circuit 30 is preferably coupled to a display 22 that is operable to display metering information. The structure and operation of such displays would be known to those of ordinary skill in the art.

The primary power supply 28 is a circuit that obtains primary electrical power from a primary power source 50 and generates primary bias power for the meter 10. In the embodiments described herein, the primary power supply 28 may suitably be connected to power line <1>c to obtain primary electrical power therefrom. The primary power supply 28 provides the primary bias power to one or more digital circuits within the meter 10, such as, for example, the measurement circuit 30 and the display 22. The primary power supply 28 furthermore provides primary bias power to circuits in peripheral device 31.

In a preferred embodiment, the primary power supply 28 is a switched mode power supply, which is well known in the art. The primary power supply 28 is preferably designed to have a maximum current output of approximately 200–300 milliamps. Switched mode power supplies having such capabilities are well known in the art.

Advanced electricity meter 10 acquires and stores in memory 32 various data related to power consumption and other metrics. The term metric (kM) refers to any electrical units being measured. Typical metrics are watthours, VA hours, kV A, kV AR, volts, and amps. Other values such as power factor are based upon these measurements. Advanced electricity meter 10 includes a microcontroller 36 and/or microprocessors to determine these other values from the metrics.

The disclosed electricity meter 10 also provides various communications functions to permit uploading new programming for onboard controller 36 and microprocessors, and for accessing or downloading stored data. Some of these communications functions are provided by a display 22 that can be operated by a meter reader or technician. Other information must be acquired using different communication interfaces. The disclosed meter 10 includes a standard optical interface 20 permitting meter reading onsite by a meter reader using any DGCOM device.

An ANSI Type II optical communications port 20 is mounted on the meter 10 and is accessible through the meter cover 26. The optical port 20 provides bi-directional communications between the data acquisition and storage hardware 30 present on the register board 18 and an external programmer or reader. All locations in the memory 32 are readable via the optical port 20. Communications through the optical port 20 is at 9600 baud and is asynchronous. Data transfer is compatible with a PC serial port. The illustrated optical port 20 utilizes an LED that is illustratively shared by a calibration output. Whenever the meter 10 is not communicating through the optical port 20 with a DGCOM device, the LED will pulse at a rate proportional to the watt-hours flowing through the meter 10. Other programmed metrics may be tested by manually scrolling to the appropriate metric calibration pulse display causing the LED to pulse proportional to that metric.

While shown in FIG. 1 as a single printed circuit board, optional PCB 24 is representative of a plurality of printed circuit boards implementing various communications options. Optional communications devices 31 present on optional PCB 24 may include relays programmable for KYZ, EOI, LC, DT A, power factor threshold alert and voltage threshold alerts or real time communications links such as modems, RS-232, RS-485, radios and power line transceivers, or the like.

For example, an optional board 24 for MODEM communications provides an alternate communication channel to the meter 10. The basic operation of the MODEM is to allow access to the meter 10 from a typical telephone connection. Once a telephone connection is established, all functions that are normally available through the optical port 20 are available through the MODEM.

An optional board 24 for RS-232 communications provides another alternate communications channel to the meter 10. RS-232 communications are transmitted via an isolated three-wire interface located in the meter's base 16 using an RJ-11 connector. The three lines (transmit, receive, and ground) each provide 2500 $V_{rms}$ isolation. This interface uses the same DGCOM protocol as the optical port 20.

In the illustrated meter, the optional communications boards 24 are installed parallel to register board 18. Both register board 18 and optional communications boards 24 include 12-pin headers facilitating coupling of the two using ribbon connectors. In the case where a relay board is also present, optional communications boards 24 may be daisy chained by plugging into a 12-pin header on optional relay board 24.

The peripheral device 31 present on optional PCB 24 typically draws power from the same on-board power supply 28 that powers the data acquisition and storage hardware 30. In the illustrated embodiment, optional communications board 24 includes power conditioning circuitry, not shown, thereon for regulating an unregulated voltage output by the meter's power supply 28. As mentioned above, optional communications devices 31 often require power to be provided at different voltage and current levels than required by data acquisition and storage hardware 30.

The disclosed load management system 40 provides controlled start-up/power-down operation of the power supply 28 under a wide variety of loading scenarios. By using a low cost solid state switch 58 controlled by a signal generated in the controller 36 already utilized in electricity meter 10, a lower cost solid state electricity meter 10 is provided that can accommodate optional communications devices 31 while securing acquired data against loss during power outages.

The illustrated solid-state electricity meter 10 stores vital billing information, power line events, time stamps, etc. in a non-volatile memory 32 once a power line outage is detected. The DC energy stored in the capacitor 34 present in the power supply 28 sustains the operation of the microcontroller 36 and the non-volatile memory 32 until the write cycle to the non-volatile memory 32 is completed. In the illustrated non-volatile memory, the write cycle takes approximately 400 mS.

The rate at which the DC energy stored in the storage capacitor 34 of the power supply 28 is depleted varies significantly when optional communication devices 31 are connected to main power supply 28. As mentioned above, some peripheral devices 31, such as radios or wireless pagers, are capable of drawing up to 250 mA dc during bursts of 100 mS and remain idle during several seconds. In the event of a power outage, if such peripheral devices 31 are not disengaged from the power supply 28, the energy stored in capacitor 34 may be depleted before the completion of a write cycle resulting in loss of power consumption data. Additionally, under the diverse loading conditions experienced when peripheral devices 31 are coupled to power supply, the charge on capacitor 34 can be depleted even without a power line outage.

Previously power supplies in electricity meters with optional communications devices were often designed to handle the worst case load conditions. However, worst case load conditions rarely occur during operation of an electricity meter equipped with optional communications devices 31. Thus, during the large majority of the time that the electricity meter 10 is in operation, such a worst case power supply design is more robust than required. As previously stated, additional robustness results in additional costs. The disclosed microcontroller based peripheral load management system 40 engages and disengages the peripheral devices 31 from the power supply 28. Such load management facilitates optimization of the design of the power supply 28 in the electricity meter 10. The disclosed load management system 40 facilitates designing a power supply 28 with a significant cost advantage over the traditional worst case power supply design.

Illustratively, the power supply 28 is provided on the measurement board 18 to power the data acquisition and storage circuits 30 on the measurement board 18 and any peripheral devices 31 on the optional boards 24. Illustratively, the power supply 28 is a wide range switching power supply that couples to the line voltage 50. Switching power supplies 28 with a wide operating range (96$V_{rms}$ to 556 $V_{rms}$) are widely used in the design of industrial solid-state electricity meters 10. As shown, for example, in FIG. 3, the illustrated switching power supply 28 includes a transformer 42, a rectifier 44, a switcher controller 46 and a capacitor 34.

The illustrated rectifier 44 is a full wave bridge rectifier that inverts the negative portion of the line signal 50. Switcher controller 46 limits the amplitude of the rectified signal by pulsing on and off to limit the amplitude of the rectified signal. This rectified amplitude limited line signal then passes through the primary coil of transformer 42. If the current present in the primary coil of transformer 42 becomes excessive, switcher controller 46 includes overcurrent protection 76 that acts to reduce the current in the primary coil. A scaled rectified amplitude limited signal is present on the secondary coil of transformer 42. The storage capacitor 34 coupled across the terminals of the secondary coil of the transformer 42 is charged by the scaled rectified amplitude limited voltage signal to provide an unregulated voltage $V_{UR}$ across the terminals of the capacitor 34. The unregulated voltage is regulated by a voltage regulator 48 which provides a regulated DC signal for powering the data acquisition and storage hardware 30 on the metering board 18. The unregulated voltage is also coupled through a switch 58 to whatever peripheral devices 31 that may be present on option boards 24.

In a variety of situations, including, but not limited to, operating at low line voltages and fully loaded during start-up or during a power line outage, the switching power supply 28 may not supply sufficient power for operation of both the data acquisition and storage hardware 30 and the peripheral devices 31. The disclosed load management system 40 disengages the peripheral devices 31 from the power supply 28 until the power supply 28 is in full regulation or when it is sensed that the power supply 28 is no longer fully regulated. The illustrated intelligent load management system 40 for electricity meter 10 is based on a microcontroller 36 that engages and disengages peripheral devices 31, and the capacitive loads 78 and resistive loads 86 associated therewith, from the power supply 28 under certain specified conditions.

The disclosed load management system 40 disengages peripheral devices 31 when either one of two conditions are met. If the actual energy stored in the storage capacitor 34 of the main power supply 28 is below a threshold voltage, the illustrated load management system opens switch 58 to disengage the peripheral device 31 present on the option board 24. Also, upon the initiation of a start-up or power-down sequence, the illustrated load management system opens switch 58 to disengaged peripheral devices 31 present on the option board 24.

Illustratively, switching power supply 28 includes an intermediate output of an unregulated voltage $V_{UR}$ 52 and a regulated voltage output 54. Illustratively, the regulated voltage output 54 by switching power supply 28 is +5 V dc. Regulated voltage 54 is provided to power the integrated circuits including sensors 56, memory or registers 32 and microcontroller 36 and other components present on the data acquisition and storage hardware 30 on the register board 18. Peripheral devices 31 powered by the switching power supply 28, such as modems, KYZ options, RS-232/RS-485, radios, etc., that may pose a heavy loading on switching power supply 28 are disabled during the initial start-up period. Once switching power supply 28 has reached its steady state operation, load management system 40 enables the operation of the peripheral devices 31. Furthermore, during the loss of AC power, load management system 40 disengages all peripheral devices 31 early in the power down sequence to allow more time to store service related information in non-volatile memory (EEPROM) 32.

Figure 4:
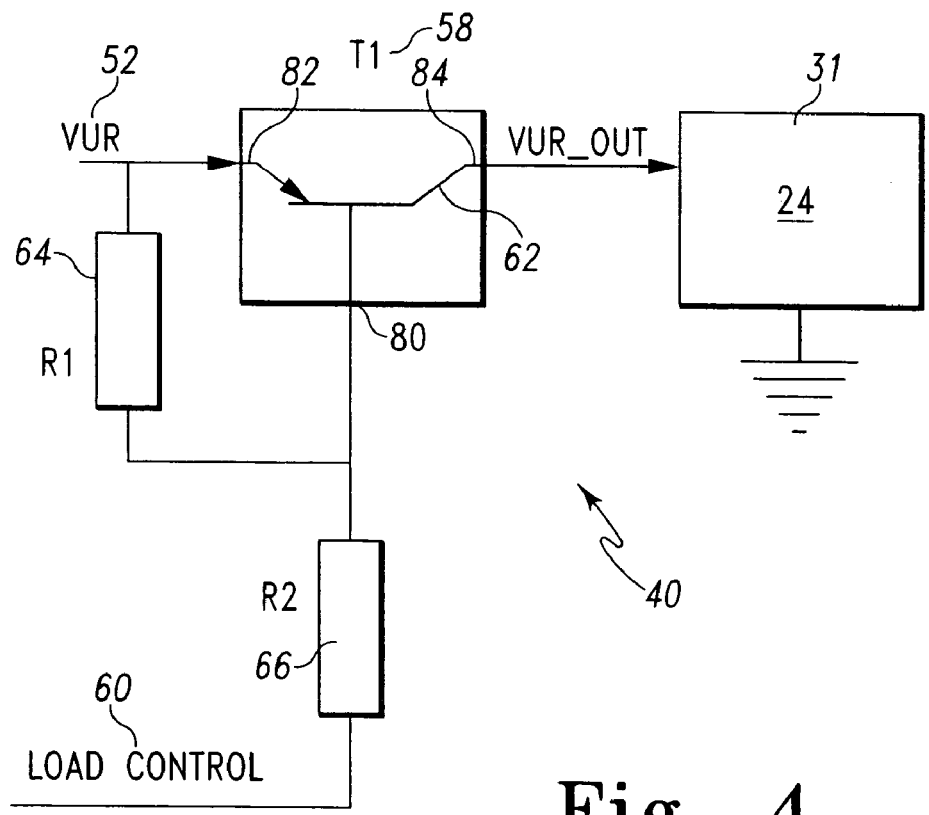
FIG. 4 is a schematic diagram of a load management system implementation of FIG. 3.
Figure 3:
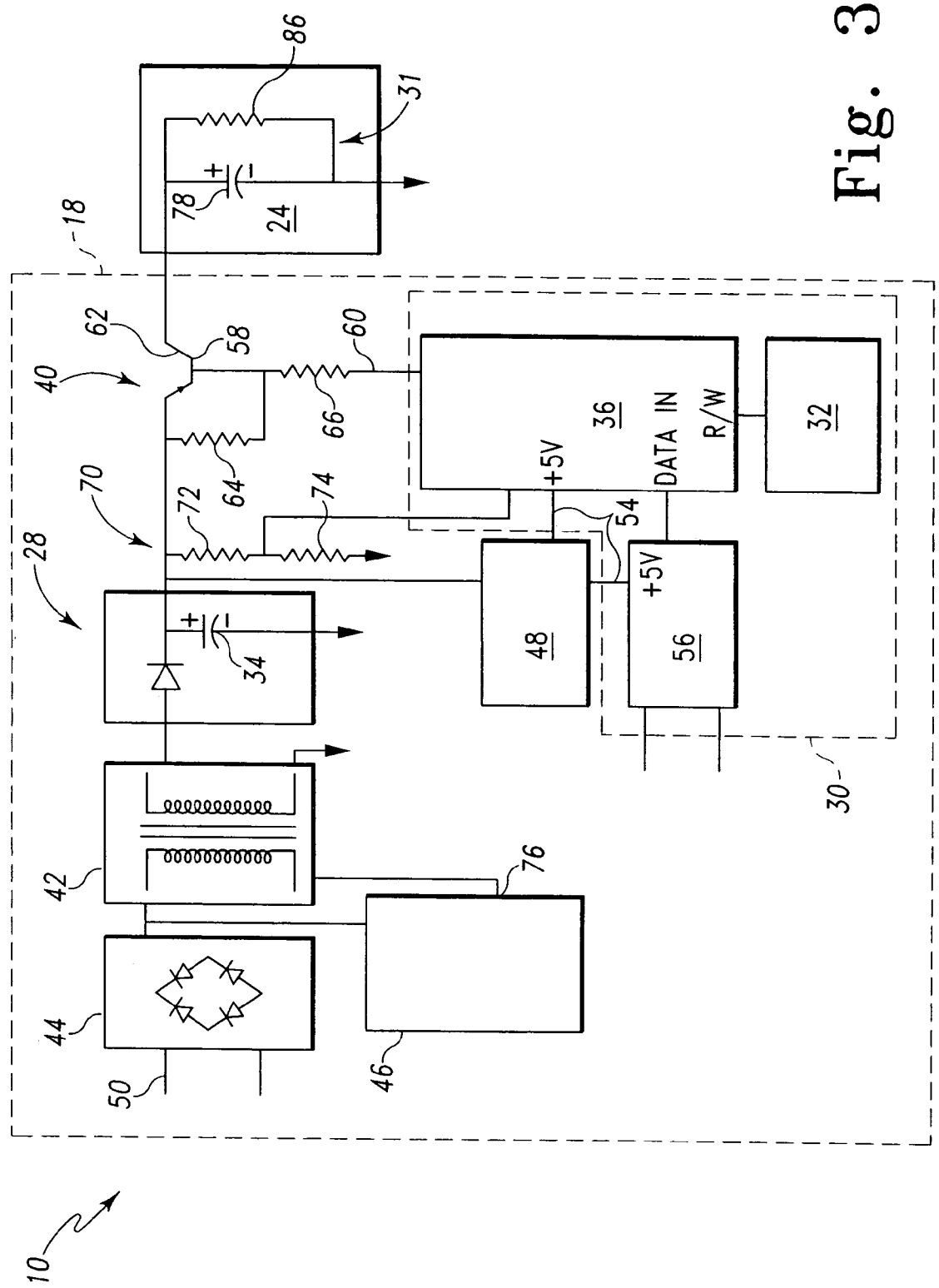
FIG. 3 is a schematic block diagram of the data and acquisition hardware, communications hardware and load management system for a power supply including a full wave bridge, a switcher controller with over current protection, a transformer, a diode and storage capacitor and a voltage regulator.

As shown for example in FIGS. 3 and 4, the load management system 40 includes an electrically controlled switch 58 having an ON state wherein power is supplied to the peripheral devices 31 and an OFF state wherein power is not supplied to the peripheral devices 31. The disclosed load management system 40 implements electrically controlled switch 58 using a transistor 62 and resistors 64, 66. In the disclosed embodiment of load management system, the transistor 62 is a high current PNP transistor for switching applications available from ON Semiconductor, 5005 East McDowell Rd., Phoenix, Ariz. 85008 as part No. MMBT6589T1. Other transistors, relays, and switches may be used within the scope of the disclosure.

Illustratively, a voltage divider includes a first resistor 64 and a second resistor 66. Illustratively, first resistor 64 is a 10 kOhm resistor and second resistor 66 is a 1 kOhm resistor. These resistor values are selected to provide a gate voltage sufficient to turn transistor 62 fully on when the LOAD_CONTROL signal is present on the appropriate pin of microcontroller 36.

Illustratively, switch 58 is responsive to a LOAD_CONTROL signal 60 generated under conditions described below. Illustratively, the LOAD_CONTROL signal 60 is generated by the microcontroller 36. Meter 10 includes the microcontroller 36 for digital signal processing of, and for calculation of power consumption data from, metrics sensed by sensors 56. The illustrated embodiment of the load management system 40 utilizes the microcontroller 36 already present on the register board 18 to implement a signal generator 68 (see FIG. 2) of the load management system 40. Illustratively, LOAD_CONTROL signal 60 is generated by the microcontroller 36 that is an 8-bit microcontroller available from NEC as part No. uPD78F0338.

In the illustrated meter 10, the microcontroller 36 is already present on the register board 18 and is programmed to generate an alert signal when voltage is low on R_ATTN line. This signal is illustratively used also as LOAD_CONTROL signal 60. It is within the scope of the disclosure, for LOAD_CONTROL signal 60 to be generated by other signal generators 68 such as controllers, processors, logic circuits and the like.

In the illustrated embodiment, the microcontroller 36 senses continuously the unregulated output ($V_{UR}$) of the auto-ranging switching power supply 28 through one of its analog inputs (analog to digital converter input PI0/ANI0, pin#27). The unregulated output of the capacitor 34 may be too high at times for input directly into the microcontroller 36. Therefore, the unregulated voltage ($V_{UR}$) is conditioned with a voltage divider 70 including a first conditioning voltage divider resistor $R_{C2}$ 72 and a second conditioning voltage divider resistor Rc2 74. Illustratively, the first conditioning resistor 72 is a 24 Kohm, $\frac{1}{16}$ Watt, 1% tolerance resistor and the second conditioning resistor 74 is a 10 Kohm, $\frac{1}{16}$ Watt, 1% resistor.

The illustrated switching power supply controller 46 possesses an internal over-current protection 76 that shuts down the switching power supply 28 when the current flowing through the primary of the transformer 42 exceeds a reset threshold. As soon as the current returns to safe levels, the switching power supply 28 is enabled by the switcher controller 46. An appropriate switcher controller 46 may be selected from the TinySwitch Family, available from Power Integrations, Inc., 5245 Hellyer Avenue, San Jose, Calif. 95138 USA. The illustrated switcher controller 46 is part No. TNY253 from that family of switches. It is within the scope of the disclosure for other switching controllers to be used in the power supply 28.

Typically during the initial start-up process, the switching power supply) 28 has to charge all the capacitive loading connected to the secondary side of the transformer 42. In the illustrated embodiment, this includes storage capacitor 34 of power supply 28 and the capacitive load 78 of the option peripheral device 31. Additional capacitive loads may be present on the main board 18 such as the optional mass memory storage ("RAM") 25, as shown, for example, in FIG. 1. These sometimes heavy loads create peak currents in the primary side of transformer 42 that trigger the over-current protection 76 of the switcher controller 46 forcing the power supply 28 to shut down. This phenomenon is compounded in a wide range switching power supply 28 when it has to start up at the low end of its operating range fully loaded. The disclosed load management system 40 removes the capacitive load 78 and resistive load 86 associated with the optional peripheral device 31 during the critical start-up/power-down cycles. Peripheral devices 31 are then engaged to main power supply 28 under certain conditions explained below.

Figure 5:
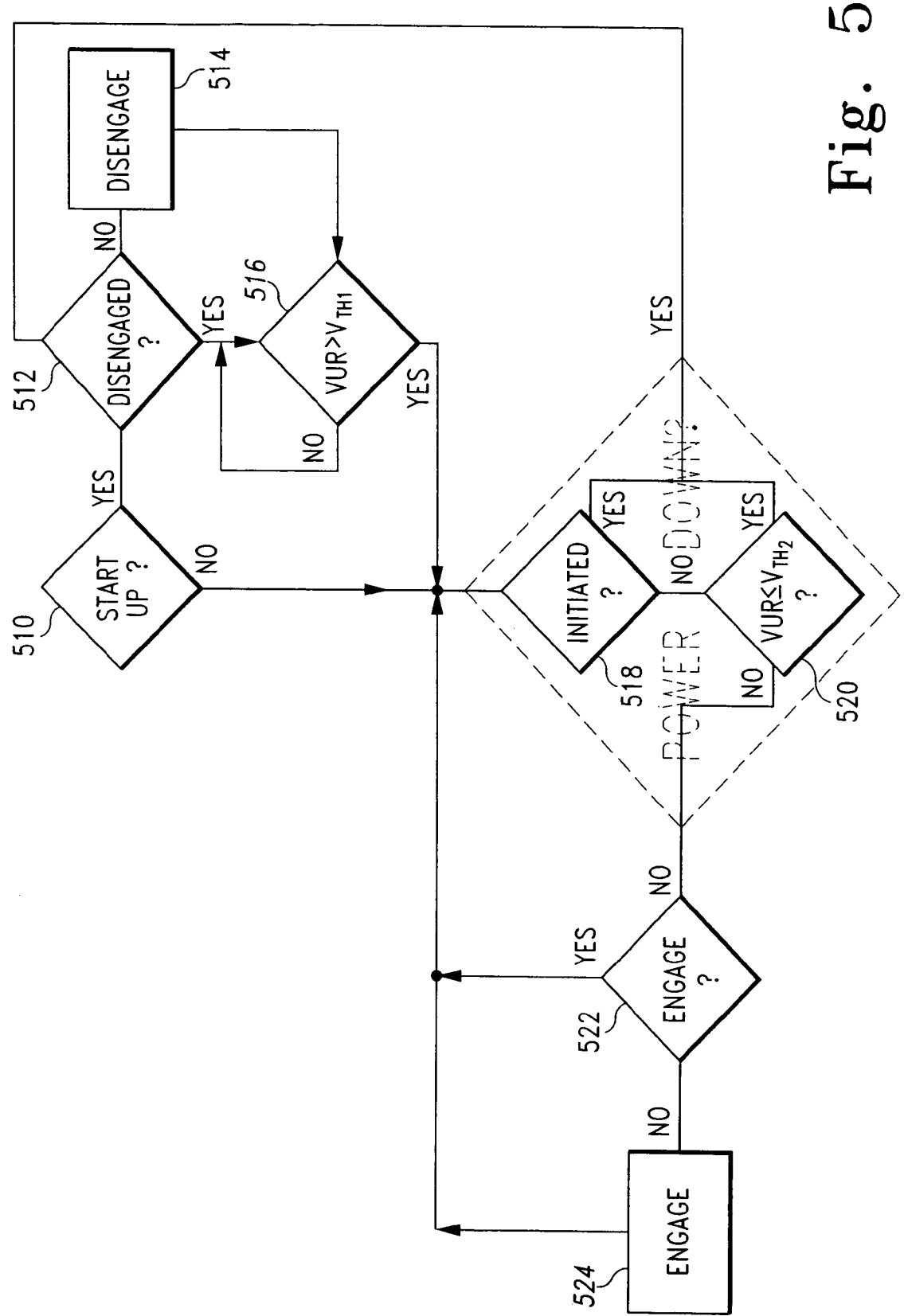
FIG. 5 is a flow diagram of a load management algorithm implemented by the load management systems disclosed herein.

As shown for example in step 510 in FIG. 5, load management system 40 initially determines whether meter 10 is in start-up mode. If so, load management system 40 determines in step 512 whether peripheral devices 31 are disengaged. If the peripheral devices 31 should be disengaged but are not disengaged, load management system 40 disengages the peripheral devices in step 514. Once the peripheral devices are appropriately disengaged, load management system 40 keeps the peripheral devices disengaged until it determines in step 516 that the unregulated voltage $V_{UR}$ exceeds a first threshold voltage $V_{TH1}$. Once the regulated voltage exceeds the first threshold voltage, the start-up sequence is complete and load management system 40 then determines in step 518 if a power-down sequence has started.

Once it is determined that meter 10 is not in start-up mode, or after disengaging the peripheral devices 31 because meter is in start-up mode and waiting until the unregulated voltage has reached the first threshold voltage, the microcontroller 36 determines whether meter is going through a power-down mode in steps 518 and 520.

Illustratively two methods are used to determine if a meter 10 is going through a power-down mode. If the power-down mode is user implemented, then microcontroller 36 detects the presence of a user implemented signal initiating a power-down in step 518. If the meter 10 is going through a user implemented power down mode, load management system 40 determines in step 512 whether peripheral devices 31 are disengaged. If the peripheral devices 31 should be disengaged but are not disengaged, load management system 40 disengages the peripheral devices in step 514. The peripheral devices remain disengaged until it is determined in step 516 that the unregulated voltage has again exceeded the first threshold voltage.

If the user has not initiated a power down sequence, but the unregulated voltage is determined in step 520 to be less than or equal to a second threshold voltage then the load management circuit 40 in steps 512 and 514 disengages the peripheral devices 31 if they are not already disengaged. The peripheral devices remain disengaged until it is determined in step 516 that the unregulated voltage has again exceeded the first threshold voltage. A non-user implemented power-down sequence may result from, among other things, a power line outage or excessive loads on the power supply 28.

If there is no uncompleted start-up or power-down cycle in progress, then load management system 40 determines in step 522 whether the peripheral devices are engaged to the power supply. If the peripheral devices 31 are not engaged but they should be, then in step 524 the load management system 40 engages the peripheral devices 31. Once the peripheral devices are connected to the power supply 28 the load management system 40 continues to check for the presence of a power-down sequence by repeating steps 518, 520, 522.

Thus, as shown, for example, in FIG. 5, based on the sampled unregulated voltage ($V_{UR}$), the micro controller 36 engages in a load management decision making process. The microcontroller 36 determines through its PIO/AN10 input if the peripheral device 31 should be decoupled from the switching power supply 28 by comparing the sensed unregulated voltage to a threshold voltage. The first and second threshold voltages $V_{TH1}$ and $V_{TH2}$ are selected to ensure that peripheral devices are connected to the power supply 28 only when power supply 28 is within its steady state of operation. In the illustrated example, the micro controller 36 determines if $V_{UR}=12V_{dc}+\_10\%$ or if the meter 10 is going through a start-up or a power-down cycle. During the initial start-up cycle, the microcontroller 36 disengages the capacitive load 78 and resistive load 86 associated with peripheral devices 31 by switching the transistor 62 to its OFF state to allow the switching power supply 28 to reach its steady state operation. The transistor 62 is switched to its OFF state by presenting a digital low signal at the base 80 of the transistor 62 prohibiting current flow from the emitter 82 to the collector 84. In the illustrated load management system 40, the digital low signal is generated by the microcontroller 36 and is present on its control line P40 which is coupled to the base 80 of the transistor 62. Once $V_{UR}$ reaches steady state, the microcontroller 36 turns the transistor 62 to its ON state by presenting a digital high LOAD_CONTROL signal 60 on control line P40 coupled to the base 80 of the transistor 62 allowing current flow between the emitter 82 and the collector 84 thereby connecting peripheral devices 31 to power supply 28.

Similarly, if the external capacitive loads 78 imposed by the peripheral devices 31 such as radios, pagers, etc cause the switcher controller 46 to trigger its over current protection 76, the microcontroller 36 senses that $V_{UR}$ is below its steady state voltage and switches the transistor 62 to its OFF state. When transistor is in its OFF state, the capacitive load 78 and the resistive load 86 associated with the peripheral device 31 are disengaged from the power supply 28. Once $V_{UR}$ reaches steady state, the microcontroller 36 turns the transistor 62 to its ON state thereby connecting peripheral device 31 to the power supply 28. If the addition of the peripheral device 31 causes $V_{UR}$ to fall below its steady state voltage, micro controller 36 again switches transistor 62 to its OFF state. This cycle may take place several times until the capacitors connected on the load side are fully charged.

In the illustrated embodiment of the load management system 40, the microcontroller 36 senses the energy stored in the power supply storage capacitor 34 and determines whether meter 10 is experiencing a line power outage. Based on this information, it engages or disengages peripheral device 31 by closing or opening the solid state switch 58 that controls the power delivered to the peripheral device 31. Thus, in the disclosed embodiment of load management system 40, the decision to engage or disengage the peripheral device 31 is made in a centralized location. In the event that a plurality of peripheral devices 31 are present in meter 10, once the decision to engage or disengage is made, all peripheral devices 31 are engaged or disengaged. Thus the load management function is centralized.

Illustratively this centralized determination or load management decision is made by the microcontroller 36 already present on PWB board 18. Additionally, load management system 40 includes a single centralized electrically controlled switch that simultaneously engages and disengages all optional peripheral loads 24. By transferring the load management functionality from the optional peripherals 24 to the central microcontroller 36 in the electricity meter 10, the in rush of currents that could cause false start-up cycles in the switching power supply 28 under heavy capacitive loads is reduced. Thus, a less robust power supply 28 is utilized in the disclosed meter 10 providing optional communications devices 31. The disclosed load management system 40 facilitates power supply design optimization since the power supply 28 need not be robust enough to power both critical and non-critical devices until the micro controller 36 enables the switch 58. Additionally, the overall cost of a series of meters 10 with optional features 31 can be significantly reduced as option boards 24 need not be implemented with load management hardware thereon.

Figure 6:
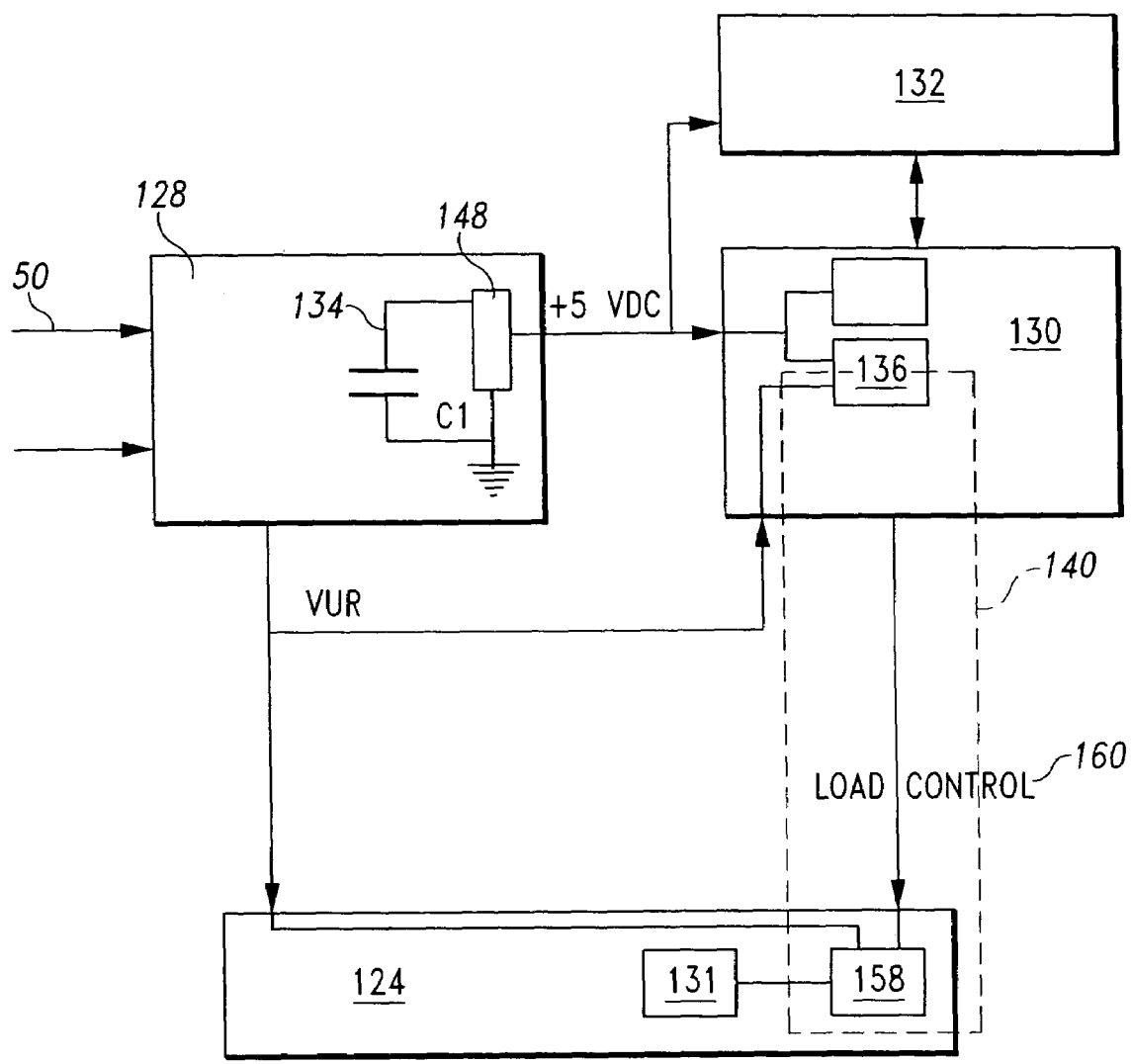
FIG. 6 is a block diagram of a second implementation of an electricity meter with load management control.
Figure 7:
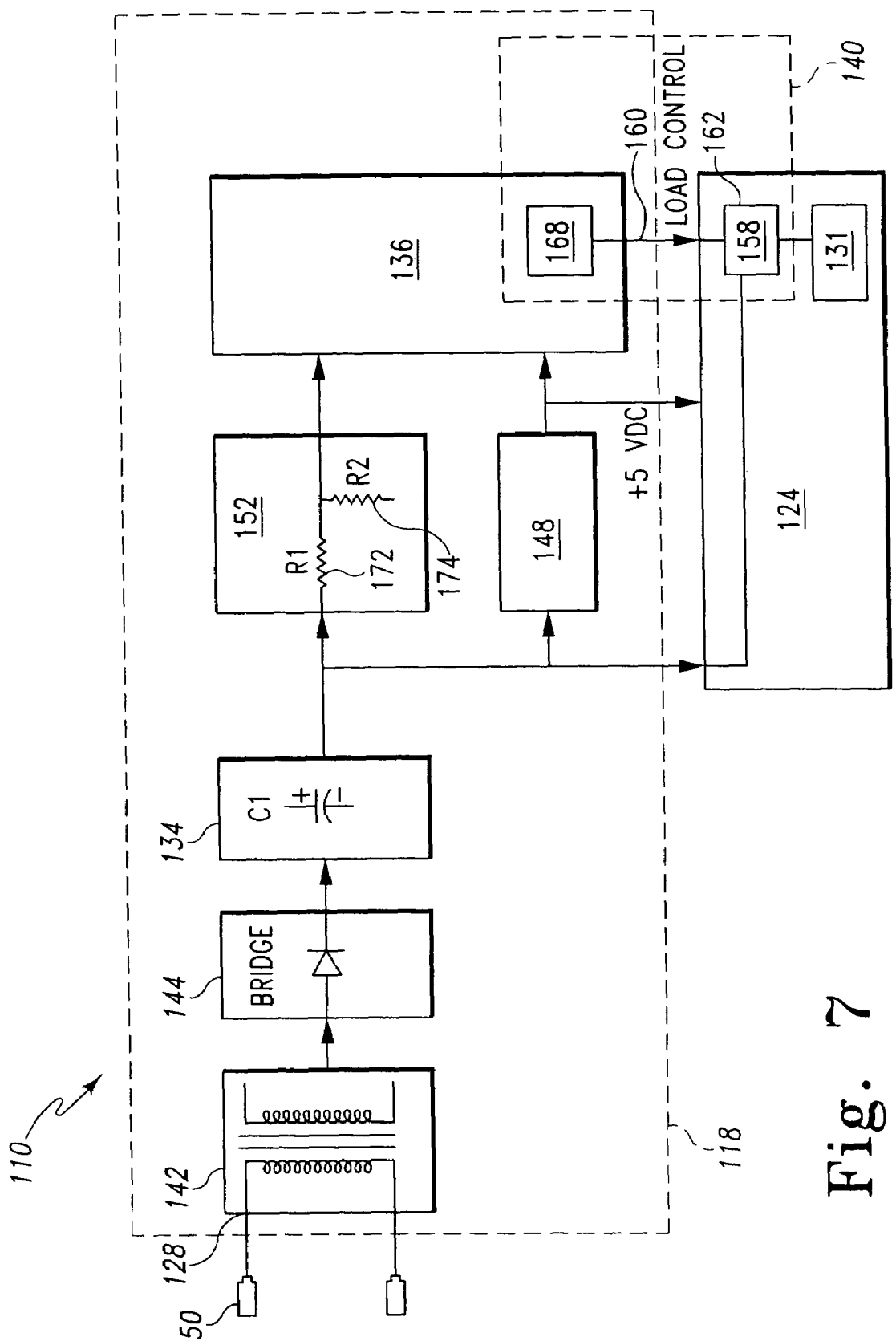
FIG. 7 is a schematic block diagram of the electricity meter with load management control of FIG. 6.

An alternative embodiment of a load management system 140 is shown for example in FIGS. 6–7. Alternative load management system 140 can be utilized with peripheral devices 131 present on option boards 124 that include switches 158 for selectively disconnecting and connecting the circuitry of the peripheral device 131 in response to a signal. Like load management system 40, load management system 140 facilitates centralized load management decision-making. Thus, while each optional board 124 upon which a peripheral device 131 is present must include its own electrically controlled switch 158, it need not include logic circuitry capable of making load management decisions. The switches 158 are relatively inexpensive when compared to the sensors and logic circuits required to sense voltage levels and implement decisions based upon the sensed voltage levels. Also, similar power supply design optimization can be achieved using the second embodiment of the load management system 140 as can be achieved using the first embodiment of the load management system 40. Thus, much of the cost savings realized by using load management system 40 can also be realized using load management system 140 in electricity meters 10, 110.

FIG. 6 shows a linear power supply 128 in a single-phase solid state—electricity meter 110. DC power is provided by the power supply 128 to the data acquisition and storage hardware 130 and the non-volatile memory 132 under any operating condition until the energy stored in the storage capacitor 134 in power supply 128 is not sufficient to sustain their continuous operation. Optional peripheral devices 131, illustratively optional communications devices such as radios, power line carrier transceivers, radios, etc, are selectively engaged or disengaged from the power supply 128 in response to a LOAD_CONTROL signal 160 generated by the microcontroller 136. The microcontroller 136 selects the value of LOAD_CONTROL signal 160 based on the DC energy available at any particular time. The availability of DC energy is determined by sensing the unregulated voltage $V_{UR}$ across the terminals of storage capacitor 134 in power supply 128.

Operation of load management system 140 is substantially similar to operation of load management system 40. The algorithm illustrated in FIG. 5 may be implemented in either load management system 40 or 140. During a start-up cycle, all peripheral devices 131 are disengaged by the microcontroller 136 sending a logical low LOAD_CONTROL signal 160 to all of the switches 158 on option boards 124. The microcontroller 136 continues to send a logical low LOAD_CONTROL signal 160 until the unregulated voltage $V_{UR}$ across the storage capacitor 134 reaches a first threshold value ($V_{TH1}$). Once the unregulated voltage is greater than the first threshold voltage ($V_{UR}>V_{TH1}$), the operation of peripheral devices 131 is enabled by microcontroller 136 sending a logical high LOAD_CONTROL signal 160 to each option board 124.

During a power down-cycle, either user implemented or as the result of a power outage or excessive load, the microcontroller 136 disengages all peripheral devices 131 when the unregulated voltage is less than or equal to a second threshold voltage ($V_{UR} \leq V_{TH2}$) to guarantee the completion of the worst-case 400 mS write cycle of the non-volatile memory 132.

As shown, for example, in FIG. 7, a second embodiment of an electricity meter 110 with load management control includes a power supply 128, a principle load illustratively including data acquisition and storage hardware present on a metering board 118, a peripheral device 131 resident on an option board 124 and a load management system 140. Illustratively, power supply 128 taps AC lines 50 to provide power to the power supply 128. A transformer 142 steps down the voltage from the line 50 and supplies the stepped down voltage to a bridge rectifier 144. Illustratively, the rectifier 144 is a full wave rectifier. An appropriate full wave rectifier 144 is available as a single integrated circuit from Diodes Incorporated, 3050 E. Hillcrest Drive Westlake Village, Calif. 91362-3154 as part No. DF02M. It is within the scope of the disclosure for rectification to be accomplished using other integrated circuits or discreet components. The rectified stepped down voltage is supplied to a storage/filtering capacitor 134 that acts to smooth the voltage wave form. Illustratively, the capacitor 134 is an aluminum electrolytic 3,300 µF, 25Vdc low impedance capacitor available from Panasonic USA a division of Matsushita Electric Corporation of America, as part no. EEUFC1V332.

In the illustrated meter 110, the unregulated voltage $V_{UR}$, i.e. the smoothed output of the storage capacitor 134, is present across the terminals of the capacitor 134. The unregulated voltage $V_{UR}$ is coupled to a voltage divider 152 having a first resistor 172 and a second resistor 174 providing a conditioned input proportional to the unregulated voltage $V_{UR}$ to the microcontroller 136.

The microcontroller 136 is configured to act in part as a signal generator 168 of load management system 140. The signal generator 168 generates the LOAD_CONTROL signal 160 regulating the state of the electrically controlled switch 158 of the load management system 140 resident on the option board 124. The unregulated voltage $V_{UR}$ is also provided as an input to the option board 124 and the switch 158. The unregulated voltage is also provided as an input to a voltage regulator 148 resident on the metering board 118. The disclosed voltage regulator 148 provides a regulated +5 Vdc signal to the microcontroller 136.

In describing load management systems 40, 140, reference had been made to microcontrollers 36, 136. In the illustrated electricity meters 10, 110, the microcontroller 36, 136 is configured to act as, at least in part, several systems and implement several functions. The microcontroller 36, 136 acts as a signal processor for converting signals representative of sensed voltages and currents into values for storage or further manipulation to generate data for storage. The microprocessor 36, 136 acts, at least in part, as a comparator for comparing the sensed regulated voltage to various threshold voltage values. The microcontroller 36, 136 acts to implement the load management decision function by determining whether a signal should be sent to engage or disengage the peripheral devices 31, 131. The microcontroller 36, 136 is configured to act in part as a signal generator 68, 168 of the load management system 40, 140. While in the described load management systems 40, 140, microcontrollers 36, 136 are used to implement the load management decision and signal generation functions of the load management circuits 40, 140, it is within the scope of the disclosure for such functions to be implemented with other controllers, processors, integrated circuits, discrete components or combinations thereof.

As shown, for example, in FIG. 7, the low cost load management system 140 includes a signal controlled electronic switch 158 selectively providing unregulated voltage $V_{UR}$ to the peripheral devices 131 when a high LOAD_CONTROL signal 160 is generated by the signal generator 168. Illustratively, signal controlled switch 158 is a discrete low cost PNP transistor 162 having its emitter 182 coupled to the unregulated voltage, its collector coupled to the peripheral device 131 and its base 180 coupled through a voltage divider to the unregulated voltage and the LOAD_CONTROL signal 160. Thus, when an appropriate high LOAD_CONTROL signal 160 is presented at the base 180 of transistor 162, the unregulated voltage $V_{UR}$ passes through the transistor 162 to the peripheral device 131.

As previously stated, the LOAD_CONTROL signal 160 is generated by signal generator 168 that in the disclosed embodiment is implemented by the microcontroller 136 resident of the main board 118. Illustratively, the LOAD_CONTROL signal 160 is presented on the open collector output already existing on pin P92 of micro controller 136. Illustratively, transistor 162 is a high current PNP transistor for switching applications available from ON Semiconductor, 5005 East McDowell Rd., Phoenix, Ariz. 85008 as part No. MMBT6589T1. Other transistors, relays, and switches may be used within the scope of the disclosure. Illustratively microcontroller 136 is an eight bit microcontroller formerly available from Hitachi Semiconductor America, now believed to be available from Renesas Technology America, Inc., 450 Holger Way, San Jose, Calif. 95134-1368 as part no. HD6473802.

The intelligent load management systems 40, 140 disclosed herein each maximizes the energy available for peripheral devices to complete communications in progress during power fail situations. The load management systems 40, 140 disclosed herein each also provide adequate reserve energy to complete essential power down storage tasks. Additionally, the load management systems 40, 140 disclosed herein each facilitate the design of a lower cost power supply that can sustain the intermittent operation of communication devices.

Although the invention has been described in detail with reference to a certain preferred embodiment, variations and modifications exist within the scope and spirit of the present invention as described and defined in the following claims.

What is claimed is:

1. A load management system for an electrical meter monitoring power usage from a service line, the meter having a power supply, a peripheral device and a data acquisition and storage circuit having a controller, the power supply being coupled to the service line and including a storage capacitor having an unregulated voltage present across its terminals, said power supply powering the data acquisition and storage circuit, the load management system comprising:
   a signal generator generating a control signal having a level dependent upon the voltage across the terminals of the capacitor;
   an electrically controlled switch having an ON state and an OFF state, the state of said switch being dependent upon the level of the control signal;
   a conductive branch coupled to the peripheral device and including the electrically controlled switch, and
   wherein when the switch is in its ON state the peripheral device is electrically coupled to and powered by the power supply and when the switch is in its OFF state the peripheral device is electrically decoupled from the power supply.

2. The load management system of claim 1 wherein the switch is a transistor.

3. The load management system of claim 2 wherein the signal generator is implemented in part by the controller of the data acquisition and storage circuit.

4. The load management system of claim 3 wherein the data acquisition and storage circuit is resident on a first board and the peripheral device is resident on a second board coupled to the first board.

5. The load management system of claim 4 wherein the switch is resident on the first board.

6. A load management system for a meter configured to monitor electric power consumed from a service line, the meter including a power supply, a peripheral device and a controller, the power supply being coupled to the service line and including a storage capacitor having an unregulated voltage present across its terminals, the load management system comprising:

a switch configured to receive a control signal, wherein the control signal is operable to transition the switch between an ON state and an OFF state, wherein the control signal and associated state of the switch are dependent upon the voltage across the terminals of the capacitor;

wherein the peripheral device is electrically coupled to the power supply when the switch is in the ON state, and wherein the peripheral device is electrically decoupled from the power supply when the switch is in the OFF state.

7. The load management system of claim 6 further comprising means for monitoring the voltage across the capacitor.

8. The load management system of claim 7 wherein the means for monitoring the voltage across the capacitor is a signal generator configured to generate the control signal.

9. The load management system of claim 6 wherein the switch is a transistor.

10. The load management system of claim 9 wherein the switch is a PNP transistor.

\* \* \* \* \*